(12) United States Patent
Gu et al.

(10) Patent No.: US 11,676,987 B2
(45) Date of Patent: Jun. 13, 2023

(54) SEMICONDUCTOR STRUCTURE AND THE MANUFACTURING METHOD THEREOF

(71) Applicant: Shanghai Huali Microelectronics Corporation, Shanghai (CN)

(72) Inventors: Zhen Gu, Shanghai (CN); Zhi Tian, Shanghai (CN); Qiwei Wang, Shanghai (CN); Haoyu Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 17/723,305

(22) Filed: Apr. 18, 2022

(65) Prior Publication Data
US 2022/0246667 A1 Aug. 4, 2022

Related U.S. Application Data

(62) Division of application No. 16/855,803, filed on Apr. 22, 2020.

(30) Foreign Application Priority Data

Apr. 3, 2019 (CN) .......................... 201910265516.1

(51) Int. Cl.
*H01L 27/146* (2006.01)
(52) U.S. Cl.
CPC .. *H01L 27/14643* (2013.01); *H01L 27/14689* (2013.01)

(58) Field of Classification Search
CPC .......... H01L 27/14643; H01L 27/14689; H01L 27/14612; H01L 27/1461; H01L 27/14601
See application file for complete search history.

(56) References Cited

U.S. PATENT DOCUMENTS

| | | | | |
|---|---|---|---|---|
| 7,388,187 B1* | 6/2008 | Liu | ...................... | H01L 27/1463 257/435 |
| 2003/0030083 A1* | 2/2003 | Lee | ................... | H01L 27/14609 257/292 |
| 2004/0094783 A1* | 5/2004 | Hong | ................ | H01L 27/14645 257/E27.134 |
| 2008/0217659 A1* | 9/2008 | Hung | ................ | H01L 27/14654 257/E27.162 |
| 2009/0026510 A1* | 1/2009 | Lim | ..................... | H01L 27/1463 257/292 |

(Continued)

*Primary Examiner* — Shaun M Campbell

(57) ABSTRACT

The present invention provides a semiconductor structure for forming a CMOS image sensor. The semiconductor structure includes at least a photodiode formed in the substrate for collecting photoelectrons, and the photodiode has a pinning layer, a first doped region and a second doped region in order from top to bottom in a height direction of the substrate. The semiconductor structure further includes a third doped region located in the substrate corresponding to a laterally extending region of the second doped region. The first doped region has an ion doping concentration greater than the ion doping concentration of the second doped region, the ion doping concentration of the second doped region is greater than the ion doping concentration of the third doped region, and the third doped region is in contact with the second doped region after diffusion. The present invention also provides a method of manufacturing the above-described semiconductor structure.

14 Claims, 7 Drawing Sheets

(56) References Cited

U.S. PATENT DOCUMENTS

| | | | |
|---|---|---|---|
| 2014/0246568 A1* | 9/2014 | Wan | H01L 27/14612 |
| | | | 438/66 |
| 2015/0137188 A1* | 5/2015 | Oike | H01L 27/14689 |
| | | | 257/225 |
| 2015/0288940 A1* | 10/2015 | Chiu | H04N 9/735 |
| | | | 348/241 |
| 2016/0155768 A1* | 6/2016 | Yi | H01L 27/14636 |
| | | | 257/225 |
| 2017/0025452 A1* | 1/2017 | Sekisawa | H01L 27/14616 |
| 2018/0061872 A1* | 3/2018 | Ohtani | H04N 5/361 |
| 2018/0247969 A1* | 8/2018 | Mori | H01L 27/14656 |

* cited by examiner

SEMICONDUCTOR STRUCTURE AND THE MANUFACTURING METHOD THEREOF

CROSS-REFERENCE TO THE RELATED APPLICATION

The present application is a division of U.S. application Ser. No. 16/855,803 filed Apr. 22, 2020 and claims priority to Chinese Patent Application No. 201910265516.1, filed Apr. 3, 2019, the entire contents of which is incorporated herein for all purposes by this reference.

TECHNICAL FIELD

The present invention relates to the field of semiconductor devices and their fabrication, and more particularly to CMOS image sensor structures and their fabrication.

BACKGROUND ART

With the development of the automotive industry, the Internet of Things and monitoring equipment, the consumption of image sensors has gradually increased. Only when the accurate patterns full of details can be obtained through the image sensor with good performance, the subsequent implementation of various functions is possible. In particular, the demand for near-infrared light for in-vehicle recorders and monitoring equipment has recently increased. The image sensor equipped with near-infrared light technology which enables the image sensor to capture images under dark conditions, and the captured image can contain more details of the object in dark light, especially suitable for the device that captures the image in dark light conditions.

The photoreceptor of the current CMOS image sensor is mainly classified into a front side illumination (FSI) and a backside illumination (BSI) according to the positional relationship between the light incident direction and the substrate and the metal connection layer. For the acquisition of near-infrared light (wavelength greater than 760 nm), the commonly used FSI structures and manufacturing methods are mainly divided into two types: one is to use ultra-high energy implantation on an N-type substrate to achieve ultra-deep boron (B) implantation (energy is greater than 4 MeV) and phosphorus (P) implantation (energy greater than 7 MeV). These pinned diodes can achieve a depth of 6 um and have good electrical isolation, using a strong barrier to isolate illuminated pixels and adjacent pixels. The other is to increase a thickness of the high-resistance P-type substrate, in this method, the efficiency of collection depends on the initial thickness of the wafer and the thermal budget experienced by the process. High-resistance substrates are primarily used to reduce interference from adjacent pixels caused by pinning diode induced potential.

As the pixel unit is reduced, in order to increase the amount of light entering, the industry has tried to adopt a BSI structure. For the BSI structure, since the silicon wafer needs to be thinned to increase the light transmission, and the absorption of visible red light is considered, the thickness of the silicon wafer is generally defined as 2.4 um (the intensity of the red light is the original 1/e). For the BSI-sensing structure, Sony has proposed a pyramid-type surface using a silicon crystal plane to increase the near-infrared quantum efficiency (QE) structure, and combined with deep isolation, can effectively improve the quantum efficiency of near-infrared light without increasing dark current. Howe's Nighthawk Nyxel technology combines thick silicon pixel architecture with Deep Trench Isolation (DTI) to improve quantum efficiency. By carefully managing the surface texture of the wafer to maintain the modulation transfer function, it does not affect the dark current of the sensor. Achieve clearer imaging with the same near-infrared light volume, or cover farther areas, or reduce the need for LED lights and reduce total power consumption.

The existing near-infrared light design focuses on the requirements for continuous image processing (video surveillance, driving recorders, autopilot cameras), and less consideration for combining static high speed. For high-speed global shutter camera (Free Join SHUTTER), it needs to completely occlude the storage node of the storage transistor to achieve accurate signal transfer. In the prior art, metal tungsten is used for occlusion, therefore photoreceptor structure using an FSI structure.

However, for near-infrared light, it is difficult to achieve the effect of not affecting the storage node. This is because the wavelength of the near-infrared light is large, and the silicon substrate thickened to enhance the optical path causes the regions to be affected by light to generate photoelectrons.

Please refer to FIG. 1 and FIG. 2. FIG. 1 shows the variation of the light intensity of four different wavelengths with the penetration depth. As can be seen from FIG. 1, when penetrating into the silicon substrate, the penetration depth of blue light (the wavelength of the 450 nm curve) while the intensity attenuates to 1/e is about 0.42 um, the green light (the wavelength of the 550 nm curve) is 1.40 um, and the red light (the wavelength of the spectrum is 600 nm) is 2.42 um, while near-infrared light (wavelength 850 nm in the figure) has a deep absorption range due to wavelength. Referring to FIG. 2, FIG. 2 shows the relationship between the parasitic light response of the storage node and the wavelength. It can be seen that the larger the wavelength, the stronger the corresponding parasitic effect, and the effect of the parasitic light becomes more serious for the near-infrared optical device.

At the same time, due to the need to completely block the storage node by using metal, the effective area of the photodiode (PD) region is lowered, and the overall photoresponse is lowered, resulting in a decrease in device performance.

Therefore, there is a need for a semiconductor structure in which a CMOS image sensor can overcome the above-mentioned problem of parasitic light caused by a long wavelength of near-infrared light and the problem that the overall light response of the device is lowered.

SUMMARY OF THE INVENTION

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to solve the above problems, a semiconductor structure capable of enhancing near-infrared light processing capability is provided, and the present invention provides a semiconductor structure for forming a CMOS image sensor. The semiconductor structure comprising at least a photodiode formed in a substrate (100) for collecting photoelectrons, wherein the photodiode has a pinning layer (210), a first doped region (220) and a second doped region (230) in order from top to bottom in a height direction of the substrate; and the semiconductor structure further includes a third doped region (300), wherein the third doped region (300) is located in the substrate (100) corresponding to a laterally extending region of the second doped region (230); wherein the ion doping concentration of the first doped region (220) is greater than the ion doping concentration of the second doped region (230), and the ion doping concentration of the second doped region (230) is greater than the ion doping concentration of the third doped region (300), the third doped region (300) is in contact with the second doped region (230) after diffusion.

In an embodiment of the semiconductor structure, optionally, the first doped region (220), the second doped region (230) and the third doped region (300) are all of a first ion doping type.

In an embodiment of the semiconductor structure, optionally, the substrate (100) and the pinning layer (210) are both of a second ion doping type, and the second ion doping type is different from the first ion doping type, the ion doping concentration of the pinned layer (210) is greater than the ion doping concentration of the substrate (100).

In an embodiment of the semiconductor structure, optionally, the semiconductor structure further comprises a storage node formed in the substrate (100), having a pinning layer (410) and an ion doped region (420) in order from top to bottom in the height direction of the substrate, the third doped region (300) is formed under the storage node, and the third doped region (300) and the ion doped region (420) of the storage node are isolated from each other.

In an embodiment of the semiconductor structure, optionally, the third doped region (300) and the ion doped region (420) of the storage node are both of a first ion doping type, and the ion doping concentration of the ion doped region (420) of the storage node is greater than the ion doping concentration of the third doped region (300).

In an embodiment of the semiconductor structure, optionally, the semiconductor structure further comprises a fourth doped region (500), the third doped region (300) is isolated from the ion doped region (420) of the storage node by the fourth doped region (500).

In an embodiment of the semiconductor structure, optionally, the substrate (100) and the fourth doped region (500) are both of a second ion doping type, the second ion doping type is different from the first ion doping type, the ion doping concentration of the fourth doped region (500) is greater than the ion doping concentration of the substrate (100).

In an embodiment of the semiconductor structure, optionally, the fourth doped region (500) further comprises an extension extending laterally toward the photodiode, and the extension further extends upward in the height direction of the substrate.

The present invention also provides a manufacturing method of manufacturing a semiconductor structure for forming a CMOS image sensor, the manufacturing method comprising:

providing a substrate (100);

forming a second doped region (230), a first doped region (220) and a pinning layer (210) sequentially from bottom to top in a height direction of the substrate in the substrate (100) to form a photodiode of the CMOS image sensor; and forming a third doped region (300) in the substrate (100) corresponding to a laterally extending region of the second doped region (230), wherein the ion doping concentration of the first doped region (220) is greater than the ion doping concentration of the second doped region (230), and the ion doping concentration of the second doped region (230) is greater than the ion doping concentration of the third doped region (300) such that the formed third doped region (300) is in contact with the second doped region (230) after diffusion.

In an embodiment of the above manufacturing method, optionally, a first type of ion doping is performed to form the first doped region (220), the second doped region (230) and the third doped region (300).

In an embodiment of the above manufacturing method, optionally, a second type of ion doping is performed to provide the substrate (100) and to form the pinning layer (210), wherein the second ion doping type is different from the first ion doping type; and the ion doping concentration of the pinned layer (210) is greater than the ion doping concentration of the substrate (100).

In an embodiment of the above manufacturing method, optionally, the manufacturing method further comprises:

forming an ion doped region (420) and a pinning layer (410) in order from bottom to top in the substrate (100) in the substrate height direction to form a storage node of the CMOS image sensor; and the storage node is formed over the third doped region (300), and the third doped region (300) is isolated from the ion doped region (420) of the storage node.

In an embodiment of the above manufacturing method, optionally, the first type of ion doping is performed to form the third doped region (300) and the ion doped region (420) of the storage node; and the ion doping concentration of the ion doped region (420) of the storage node is greater than the ion doping concentration of the third doped region (300).

In an embodiment of the above manufacturing method, optionally, the manufacturing method further comprises:

forming a fourth doped region (500) between the third doped region (300) and the ion doped region (420) of the storage node, the third doped region (300) is isolated from the ion doped region (420) of the storage node by the fourth doped region (500).

In an embodiment of the above manufacturing method, optionally, a second type of ion doping is performed to provide the substrate (100) and to form the fourth doped region (500), wherein the second ion doping type is different from the first ion doping type; and the ion doping concentration of the fourth doped region (500) is greater than the ion doping concentration of the substrate (100).

In an embodiment of the above manufacturing method, optionally, forming the fourth doped region (500) further comprises forming an extension extending laterally toward the photodiode, and forming the extension further includes extending the extension upward in a height direction of the substrate.

The semiconductor structure provided according to the present invention additionally adds an electron collecting region in the substrate, can achieve more absorption of near-infrared light, can enhance the ability of the image sensor to process near-infrared light, and improve the accuracy of the global electronic shutter. The manufacturing method of the above semiconductor structure provided by the invention is simple in process, compatible with the existing process flow, and does not additionally increase the manufacturing cost.

Figure 1:
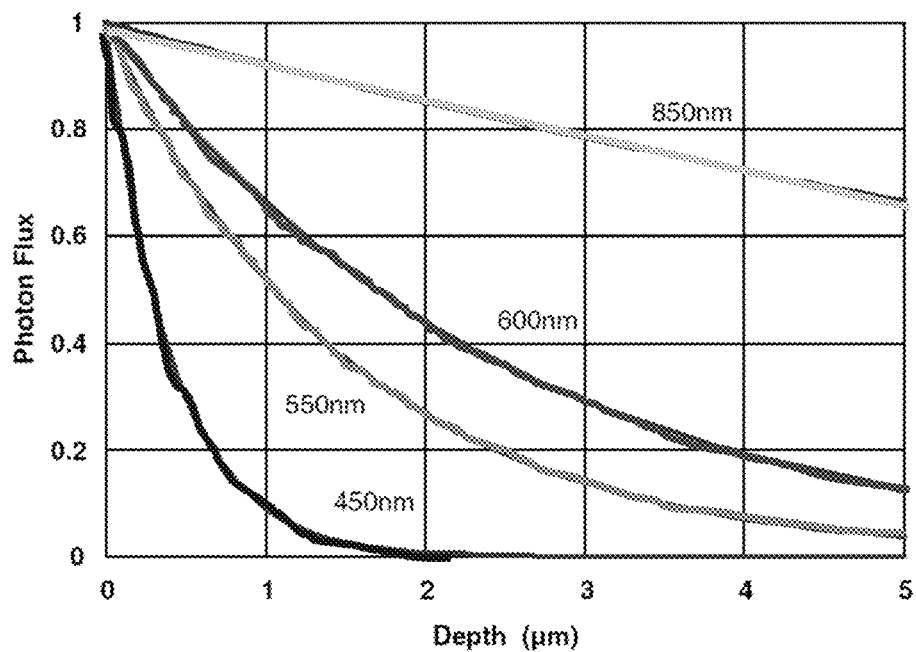
FIG. 1 shows the relationship between the light intensity of different wavelengths of light and the penetration depth.
Figure 2:
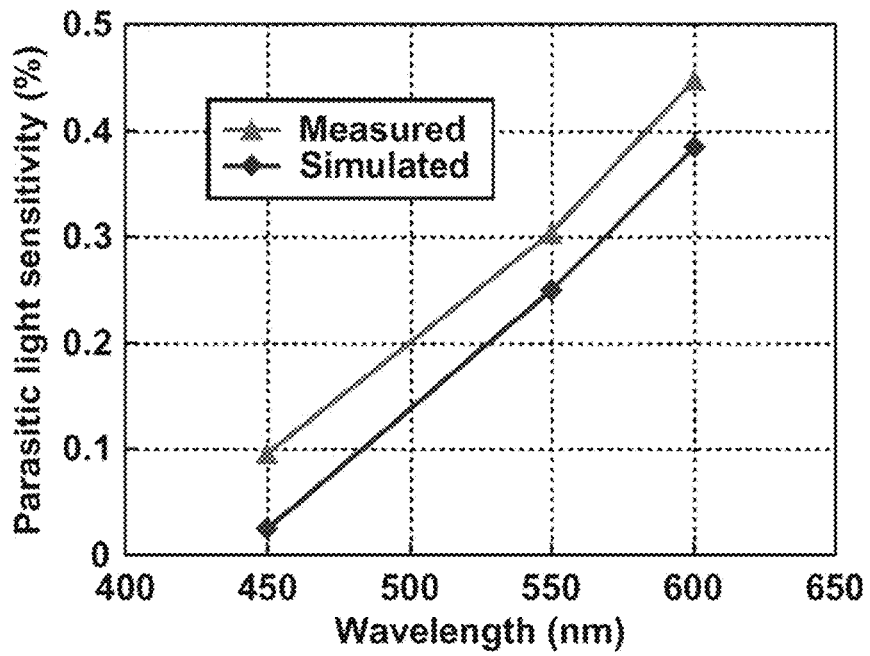
FIG. 2 shows the relationship between the parasitic light response and the wavelength of light.

REFERENCE SIGNS 100 substrate
210 pinning layer
220 first doped region
230 second doped region
300 third doped region
410 pinning layer
420 ion doped region
500 fourth doped region
510 extending portion
TX1 first transfer transistor
TX2 second transfer transistor
GS global shutter
RS selection transistor
RST reset transistor
FD floating diffusion point
STI shallow trench isolation

DETAILED DESCRIPTION OF EMBODIMENTS

The present invention relates to a semiconductor device and a method of manufacturing the same. More specifically, embodiments of the present invention provide a semiconductor structure for forming a CMOS image sensor that additionally adds an ion doped region in the substrate for collecting photoelectrons. Other embodiments are also provided.

The following description is presented to enable one of ordinary skill in the art to implement and use the present invention and incorporate it into the context of a particular application. Various modifications, as well as various usages in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 3:
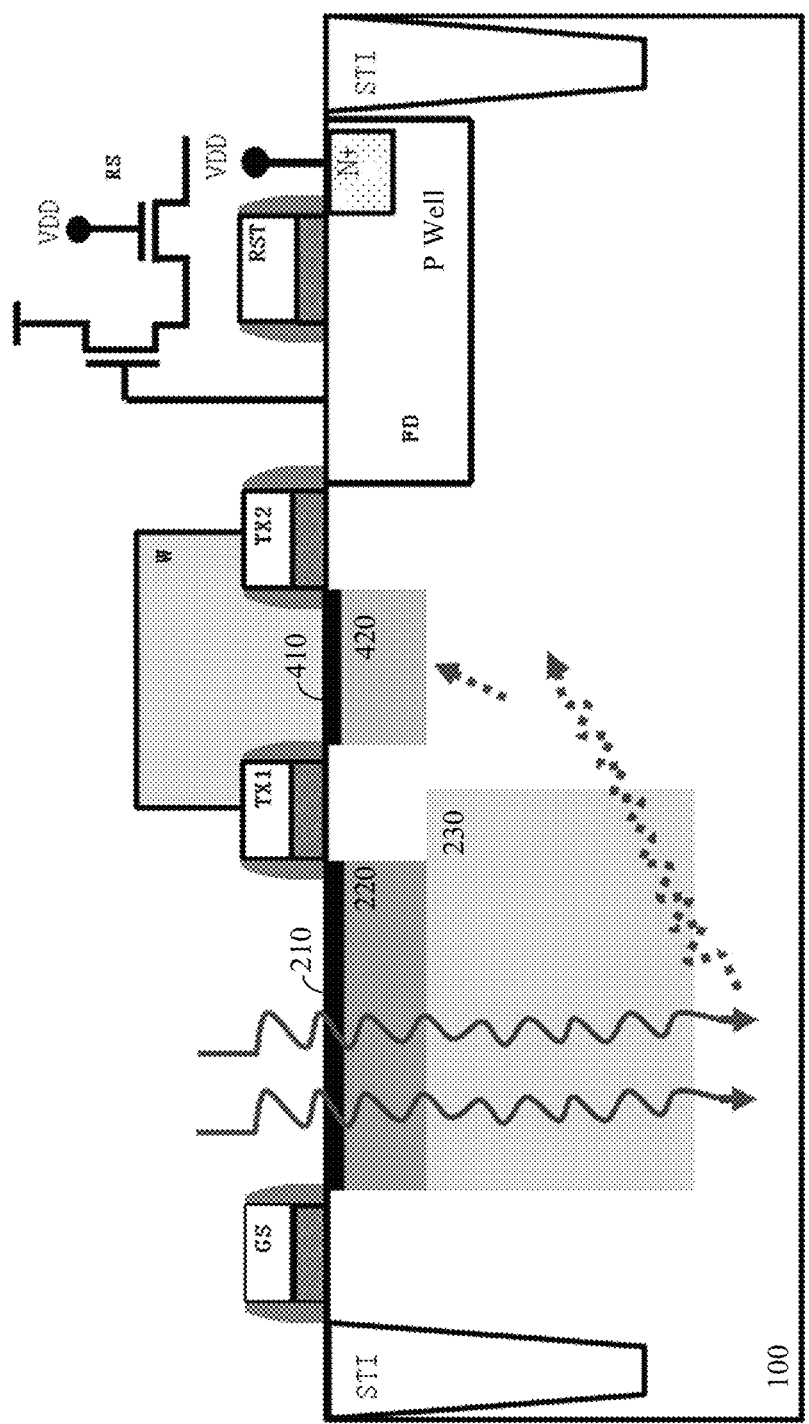
FIG. 3 shows a schematic structural view of a CMOS image sensor.

First, please refer to FIG. 3. FIG. 3 shows a schematic structural diagram of a 6T active CMOS image sensor. In this structure, the photodiode for collecting photoelectrons includes a pinning layer 210, a first doped region 220, and a second doped region 230, wherein the ion doping concentration of the second doped region 230 is lower than the ion doping concentration of the first doped region 220. The operation of the structure is as follows: (1) light enters the photodiode, as shown by the solid arrow in the figure, and photoelectrons generated in the process are collected by the first doped region 220 and the second doped region 230. Since the ion doping concentration of the second doping region 230 is lower than the ion doping concentration of the first doping region 220, a transfer path in which photoelectrons are longitudinally transferred from the second doped region 230 to the first doped region 220 is formed. The photoelectrons collected by the second doped region 230 are then stored in the first doped region 220, and in order to prevent the ion doped region 420 of the storage node from being disturbed by noise, a shading material is usually disposed above the storage node, such as the metal tungsten shown in FIG. 3. (2), turning on the first transfer transistor TX1, and transferring the charge of all the pixel units from the photodiode to the ion doped region 420 of the storage node, wherein the charge that is desired to be transferred is the charge stored in the first doped region 220 of the photodiode, rather than other noisy electrons. (3), the first transfer transistor TX1 is turned off, so that photoelectrons exist in the storage node, specifically in the ion doped region 420 of the storage node. (4), the shutter gate GS connected to the photodiode is turned on to transfer residual charge in the photodiode, and at the same time, it can prevent any additional photosensitive generated photoelectrons. (5), the charge is read out in a row from the ion doped region 420 of the storage node through the second transfer transistor TX2 and the floating diffusion point FD. The step and the subsequent steps of reading are realized by controlling the selection transistor RS and the reset transistor RST, and are not described herein.

In the structure shown in FIG. 3, if it is used to collect near-infrared light, as shown by the solid arrow in FIG. 3, since the wavelength of the near-infrared light is large, usually up to 840 um, 950 um, etc., there is a long optical path, and it is easy to enter the adjacent area (as shown by the dotted arrow in the figure). The storage node only stores photoelectrons from the photodiode and cannot be irradiated by external light, but these free photoelectrons cause the ion doped region 420 of the storage node to be affected by the incident light when the first transfer transistor TX1 is not yet turned on, which causing noise interference. Moreover, these free photoelectrons also reduce the photoresponse of the photodiode itself. Therefore, the CMOS image sensor structure as shown in FIG. 3 is not suitable for the case where dark light requires the use of near-infrared light technology.

Figure 4:
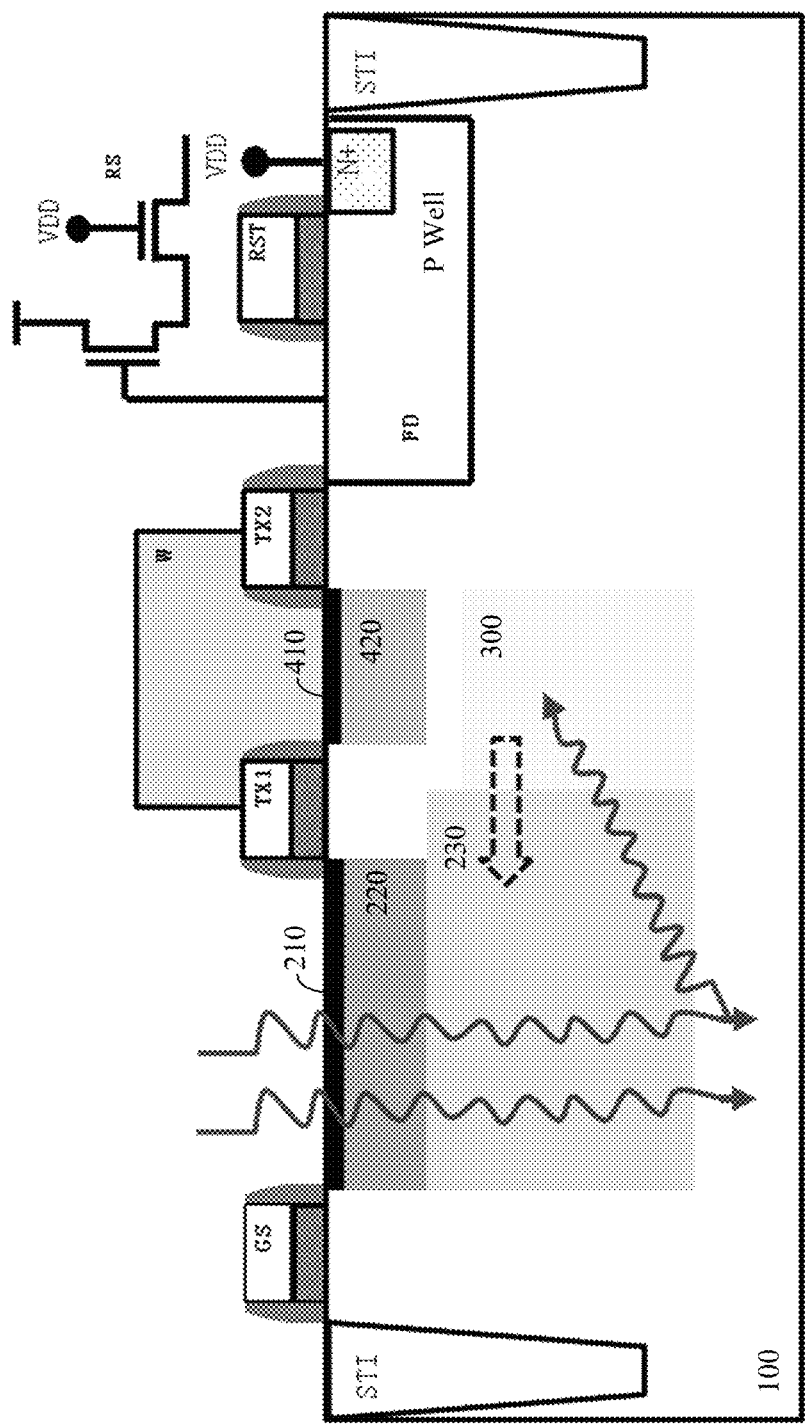
FIG. 4 is a schematic diagram showing a first embodiment of a CMOS image sensor structure provided by the present invention.

To solve the above problems, the present invention provides a method of manufacturing a semiconductor structure for forming a CMOS image sensor, please refer to FIG. 4. The semiconductor structure shown in FIG. 4 includes a substrate 100, a photodiode formed in the substrate 100, and the photodiode has a pinning layer 210, a first doped region 220 and a second doped region 230 in order from the top to the bottom in the substrate height direction, wherein the ion doping concentration of the second doped region 230 is lower than the ion doping concentration of the first doped region 220. In the substrate 100 corresponding to a laterally extending region of the second doped region 230, the semiconductor structure provided by the present invention additionally provides a third doped region 300, wherein the ion doping concentration of the third doped region 300 is lower than the ion doping concentration of the second doped region 230, and the third doped region 300 is in contact with the second doped region 230 after diffusion.

Through the structure as shown in FIG. 4, the third doped region 300 can be used together to collect near-infrared light when processing near-infrared light, and the third doped region 300 can be used to collect the original free photoelectrons of near-infrared light. In this way, the effect of the parasitic light response on the image sensor can be reduced. For the second doped region 230 of the photodiode, although the second doped region 230 has been set to a deep lightly doped region in order to more collect long wavelengths and has been laterally expanded to improve photoelectric efficiency, it is still not enough for dealing with near-infrared light. By making the ion doping concentration of the third doped region 300 smaller than the ion doping concentration of the second doped region 230, a transfer path in which photoelectrons are laterally transferred from the third doped region 300 to the second doped region 230 is formed, so that the photoelectrons of the near-infrared light collected by the third doped region 300 can be stored in the first doped region 220 through the second doped region 230. Thereby, it is possible to improve the light response speed of the photodiode region and improve the accuracy of the global electronic shutter.

In the above structure, the ion doping types of the first doped region 220, the second doped region 230, and the third doped region 300 are the same, so that photoelectrons can be smoothly transferred from the third doped region 300 to the first doped region 220. The substrate 100 and the pinning layer 210 have the same ion doping type, but are different from the ion doping type of the first doped region 220, the second doped region 230 and the third doping region 300. At the same time, the pinning layer 210 is heavily doped, and the ion doping concentration is much higher than the ion doping concentration of the substrate 100. In an embodiment, the first doped region 220, the second doped region 230 and the third doped region 300 are all N-doped, and the substrate 100 and the pinning layer 210 are both P-doped.

Further, as can be seen in the structure as shown in FIG. 4, the third doped region 300 is disposed in a laterally extending region where the second doped region 230 extends toward the storage node. In the structure shown in FIG. 4, a storage node formed in the substrate 100 is further included, and the storage node has a pinning layer 410 and an ion doped region 420 in order from the top to the bottom in the substrate height direction. The third doped region 300 is formed under the ion doped region 420, and the third doped region 300 and the ion doped region 420 are isolated from each other by the substrate 100.

Since the free electrons caused by the original near-infrared light are transferred to the ion doped region 420 of the storage node, noise is generated, and since the third doped region 300 is disposed under and isolated from the ion doped region 420, it can prevent the vertical transfer of free electrons to the storage node, greatly reducing noise interference.

For the ion doped region 420, since the charge originally stored in the first doped region 220 of the photodiode is transferred and stored in the ion doped region 420 after the first transfer transistor TX1 is turned on, the ion doping type thereof is the same as the ion doping type of the first doping region 220, and the ion doping concentration is equivalent. Therefore, the ion doping concentration of the ion doped region 420 is greater than the ion doping concentration of the third doped region 300. Thereby, in order to prevent photoelectrons in the third doped region 300 from forming a transfer channel transferred to the ion doped region 420, the third doped region 300 needs to be implanted deeper so as to be separated from the ion doped region 420.

The pinning layer 410 of the storage node and the substrate 100 are of the same doping type. Similarly, the pinning layer 410 is heavily doped, and the ion doping concentration is higher than the doping concentration of the substrate 100. In an embodiment, the first doped region 220, the second doped region 230, the third doped region 300 and the ion doped region 420 are all N-doped, and the pinning layer 210, the pinning layer 410 and the substrate 100 are all P-doped.

In the first embodiment described above, by adding an additional doped region at the bottom of the storage node, the concentration of this doping is controlled to be lower than the photodiode region, forming an electron lateral transfer path from the bottom region of the storage node to the bottom region of the photodiode. On the one hand, the idle area at the bottom of the storage node can be used to additionally collect photoelectrons generated by near-infrared light to enhance the photo-responsive speed of the photodiode. On the other hand, the additional doped region also reduces the probability of the free photoelectron being transferred longitudinally to the storage node; thereby it can reduce the light response speed of the storage node area and improve the accuracy of the global electronic shutter.

Figure 5:
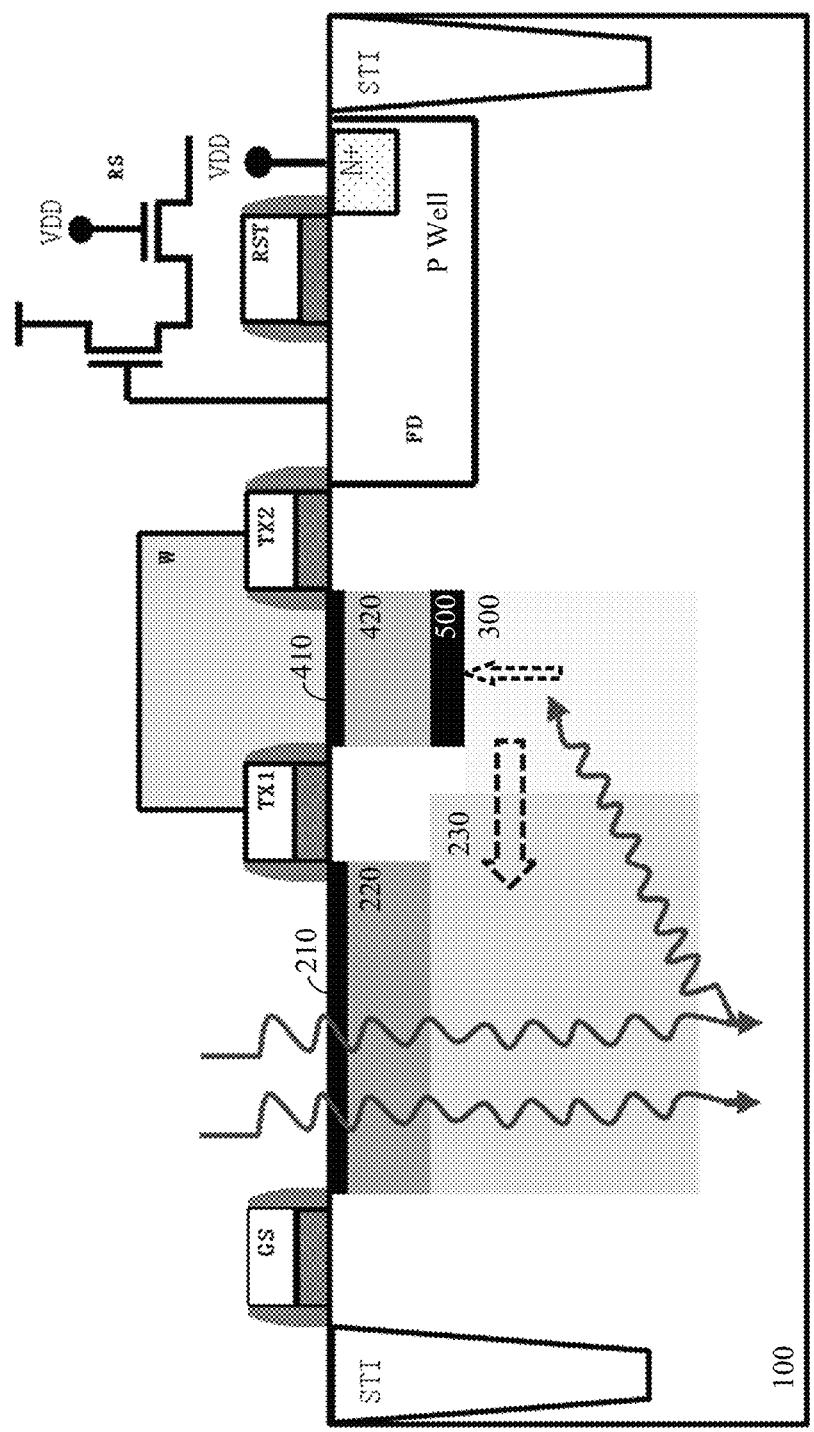
FIG. 5 is a schematic diagram showing a second embodiment of a CMOS image sensor structure provided by the present invention.

Preferably, please refer to FIG. 5. FIG. 5 illustrates another embodiment of a semiconductor structure provided by the present invention. In the embodiment shown in FIG. 5, its structure is substantially the same as that of the embodiment shown in FIG. 4. The difference is that, compared with the semiconductor structure shown in FIG. 4, a fourth doped region 500 is added between the third doped region 300 and the ion doped region 420, and the third doped region 300 and the ion doped region 420 are blocked by the fourth doped region 500. Thereby, the isolation effect between the third doped region 300 and the ion doped region 420 is significantly improved.

Further, in order to function as a barrier, the ion doping type of the fourth doped region 500 is different from the third doped region 300 and the ion doped region 420. In one embodiment, the third doped region 300 and the ion doped region 420 are N-type doped, the fourth doped region 500 and the substrate 100 are P-type doped. Moreover, the ion doping concentration of the fourth doped region 500 is higher than the doping concentration of the substrate 100, which effectively blocks the transfer of photoelectrons from the third doped region 300 to the ion doped region 420.

By adding the fourth doped region 500 between the third doped region 300 and the ion doped region 420, the third doped region 300 can be made to be separated from the ion doped region 420 without being injected too deeply. Thereby simplifies the formation of the third doped region 300.

Figure 6:
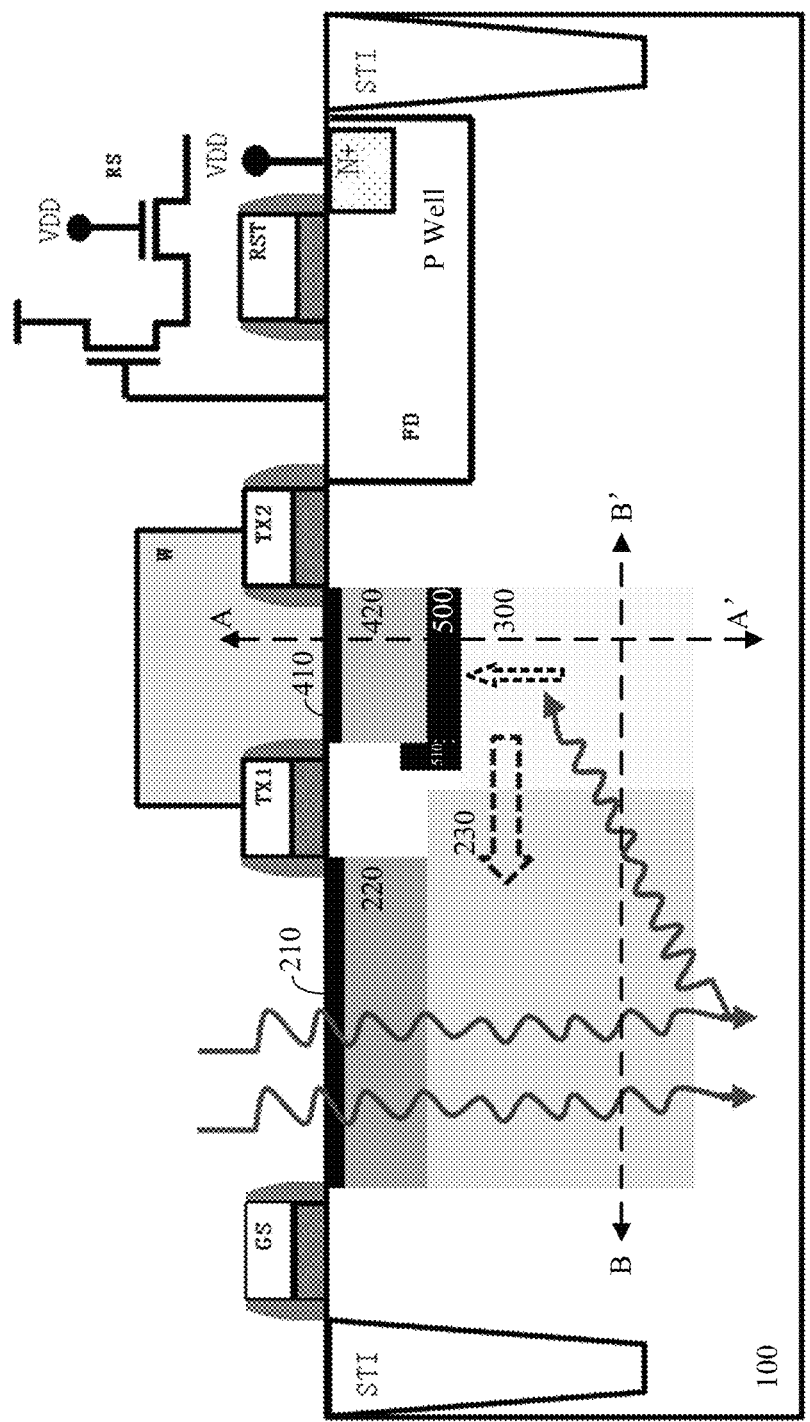
FIG. 6 is a schematic diagram showing a third embodiment of a CMOS image sensor structure provided by the present invention.

More preferably, please refer to FIG. 6, which illustrates another embodiment of a semiconductor structure provided by the present invention. In the embodiment shown in FIG. 6, the structure is substantially the same as the embodiment shown in FIG. 5. The difference is that, compared with the semiconductor structure shown in FIG. 5, the fourth doped region 500 further includes an extending portion 510 extending laterally toward the photodiode, and the extending portion 510 further extends upward in the substrate height direction.

By providing the extending portion 510 of the barrier layer, it is possible to protect the ion implantation region of the storage node from below and near the side of the photodiode in the photoelectron collection phase, preventing noise of free near-infrared light from entering the ion implantation region of the storage node.

Moreover, by providing the extending portion 510 of the barrier layer, accurate transfer of photoelectrons can also be achieved during photoelectron transfer. As described above, the charge stored in the first doped region 220 of the photodiode is transferred to the ion doped region 420 of the storage node after the first transfer transistor TX1 is turned on. In this transfer process, it is desirable to enable photoelectrons to be transferred from the photodiode to the storage node via the surface of the substrate 100 as much as possible, thereby ensuring the accuracy of transfer, reducing errors, and reducing noise. Therefore, by additionally providing a barrier layer to extend toward the photodiode region, and to extend toward the surface of the substrate 100, a potential barrier can be formed, so that the photoelectrons are transferred as much as possible via the surface of the substrate 100 during transfer, thereby ensuring the accuracy of the transfer and improving the accuracy of the global shutter image sensor.

Thus far, the semiconductor structure provided by the present invention for forming a CMOS image sensor has been described. According to the semiconductor structure provided by the present invention, it is possible to effectively collect near-infrared light, reduce the parasitic light effect caused by near-infrared light scattering, enhance the optical response speed of the image sensor, and improve the ability of the global shutter image sensor to process near-infrared light. More preferably, the semiconductor structure provided by the invention can also ensure that the storage node is not affected by the free photoelectron noise, and at the same time, can ensure the accurate transfer of the charge stored in the photodiode light during the transfer, thereby improving the accuracy of the transfer and improving the accuracy of the global shutter image sensor.

Figure 7A:
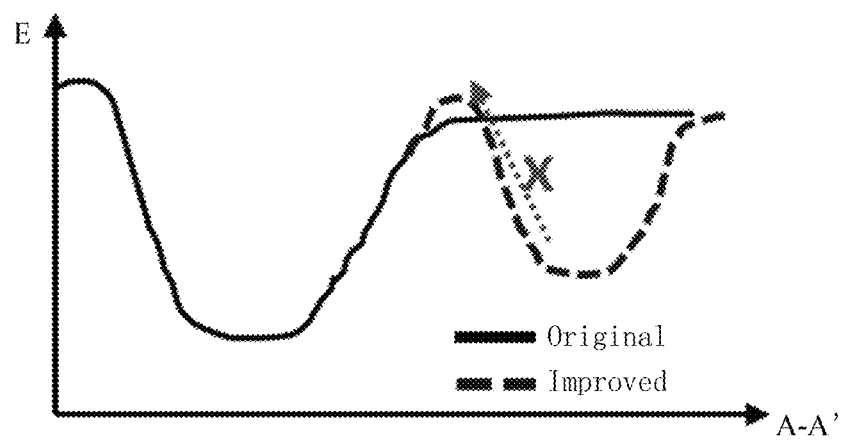
FIG. 7A shows the energy potential diagram along the AA' direction in the third embodiment shown in FIG. 6.
Figure 7B:
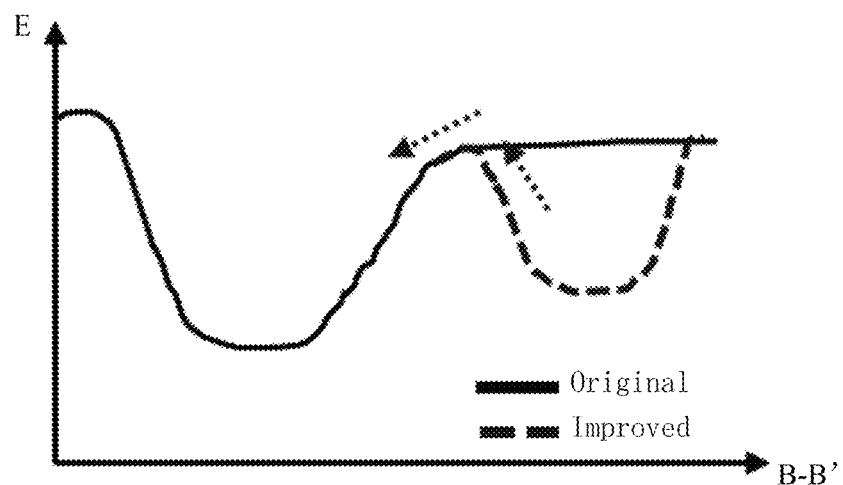
FIG. 7B shows the energy potential diagram along the BB' direction in the third embodiment shown in FIG. 6.

Please referring to FIGS. 7A and 7B, FIG. 7A shows an energy potential diagram along the AA' direction in an embodiment of the semiconductor structure shown in FIG. 6. FIG. 7B shows an energy potential diagram along the BB' direction in an embodiment of the semiconductor structure shown in FIG. 6.

In FIG. 7A, the ordinate indicates the potential with respect to electrons, and the abscissa indicates the distance coordinate of the A-A' direction. As can be seen from FIG. 7A, the newly added fourth doped region 500 acts as a barrier to block the effects of external photoelectrons.

In FIG. 7B, the ordinate indicates the potential with respect to electrons, and the abscissa indicates the distance coordinate in the B-B' direction. As can be seen from FIG. 7B, the newly added third doped region 300 acts as an additional collection layer to additionally collect near-infrared photoelectrons and the additionally collected near-infrared photoelectrons can be transferred to the photodiode region storage.

A person skilled in the art should know that the CMOS image sensor may further include a global shutter GS, a second transfer transistor TX2, a floating diffusion point FD, a selection transistor RS, a reset transistor RST and the like to complete a complete processing operation, and details are not described herein again.

Figure 8:
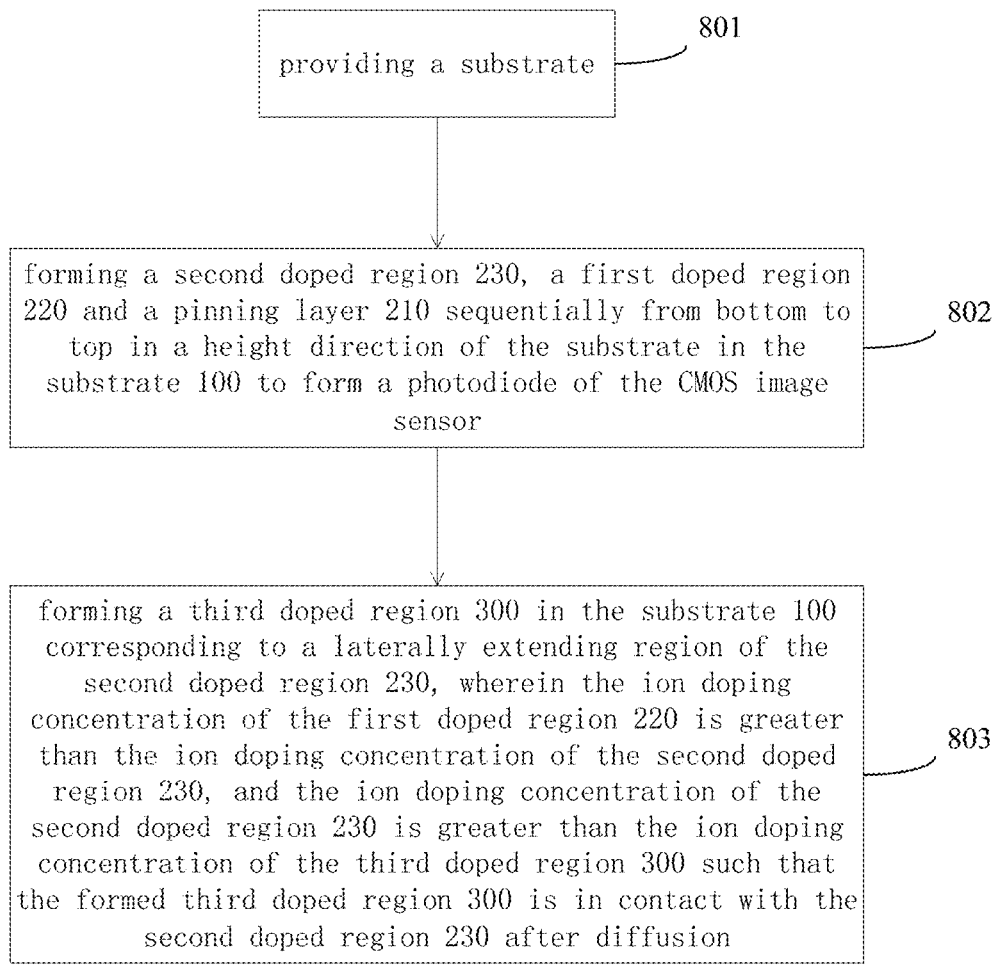
FIG. 8 is a flow chart showing the manufacturing method provided by the present invention.

The present invention also provides a manufacturing method of manufacturing the semiconductor structure described above. Specifically, please refer to FIG. 8, which shows a simplified flow chart of the manufacturing method provided by the present invention.

The manufacturing method provided by the present invention includes at least step 801: providing a substrate 100; and step 802: forming a second doped region 230, a first doped region 220 and a pinning layer 210 sequentially from bottom to top in a height direction of the substrate in the substrate 100 to form a photodiode of the CMOS image sensor; and step 803: forming a third doped region 300 in the substrate 100 corresponding to a laterally extending region of the second doped region 230. The ion doping concentration of the first doped region 220 is greater than the ion doping concentration of the second doped region 230, and the ion doping concentration of the second doped region 230 is greater than the ion doping concentration of the third doped region 300 such that the formed third doped region 300 is in contact with the second doped region 230 after diffusion.

More specifically, the first doped region 220, the second doped region 230 and the third doped region 300 are all of the same doping type. In one embodiment, the doping type is N-type. The substrate 100 and the pinning layer 210 are of the same doping type, but different from the doping types of the first doped region 220, the second doped region 230 and the third doping region 300. In an embodiment, the doping type of the substrate 100 and the pinning layer 210 is P-type, and the ion doping concentration of the pinning layer 210 is greater than the ion doping concentration of the substrate 100.

In one embodiment, the above manufacturing method further includes: sequentially forming an ion doped region 420 and a pinning layer 410 in a substrate 100 from bottom to top in a substrate height direction to form a storage node of the CMOS image sensor; and a storage node is formed over the third doped region 300, and the third doped region 300 is isolated from the ion doped region 420 of the storage node.

Specifically, the third doped region 300 and the ion doped region 420 of the storage node are both of the same doping type, and the ion doping concentration of the ion doped region 420 of the storage node is greater than the ion doping concentration of the third doped region 300. In an embodiment, the doping type is N-type.

More preferably, the manufacturing method provided by the present invention further includes forming a fourth doped region 500 between the third doped region 300 and the ion doped region 420 of the storage node, and the third doped region 300 is isolated from the ion doped region 420 of the storage node by the fourth doped region 500.

The fourth doped region 500 and the substrate 100 are both of the same doping type, but different from the doping type of the third doped region 300 and the ion doped region 420 of the storage node, and the ion doping concentration of the fourth doped region 500 is greater than the ion doping concentration of the substrate 100. In an embodiment, the doping type of the substrate 100 and the fourth doped region 500 is P-type.

Still further, forming the fourth doped region 500 further includes forming an extension portion 510 extending laterally toward the photodiode direction, and forming the extension portion 510 further includes extending the extension portion 510 upward in the substrate height direction.

It should be noted that the N-type doping referred to in the present invention may have a dopant such as arsenic (As), phosphorus (P), other group V elements or a combination of the foregoing. The P-type doping referred to in the present invention may have a dopant such as boron (B) or other group III element.

Those skilled in the art will appreciate that the manufacturing method provided by the present invention only additionally increases the formation step of the ion implantation region and is compatible with the current existing process flow. And the step of ion implantation can be achieved by existing or future techniques, and is not limited thereto.

Moreover, the semiconductor structure for forming a CMOS image sensor manufactured according to the manufacturing method provided by the present invention can effectively collect near-infrared light, reduce the parasitic light effect caused by near-infrared light scattering, enhance the optical response speed of the image sensor, and improve the ability of the global shutter image sensor to process near-infrared light. More preferably, the semiconductor structure provided by the invention can also ensure that the storage node is not affected by the free photoelectron noise, and at the same time, can ensure the accurate transfer of the charge stored in the photodiode light during the transfer, therefore improving the transfer accuracy, and improving the accuracy of the global shutter image sensor.

Heretofore, embodiments of the semiconductor structure and the method of manufacturing the same provided by the present invention have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

The invention claimed is:

1. A manufacturing method of manufacturing a semiconductor structure for forming a CMOS image sensor, the manufacturing method comprising:
   providing a substrate;
   forming a second doped region, a first doped region and a first pinning layer sequentially from bottom to top in a height direction of the substrate in the substrate to form a photodiode of the CMOS image sensor;
   forming a third doped region in the substrate corresponding to a laterally extending region of the second doped region;
   forming an ion doped region and a second pinning layer in order from bottom to top in the substrate in the height direction of the substrate to form a storage node of the CMOS image sensor; and
   forming a fourth doped region between the third doped region and the ion doped region of the storage node,
   wherein the storage node is formed over the third doped region, and the third doped region is isolated from the ion doped region of the storage node by the fourth doped region,
   wherein the ion doping concentration of the first doped region is greater than the ion doping concentration of the second doped region, and the ion doping concentration of the second doped region is greater than the ion doping concentration of the third doped region such that the formed third doped region is in contact with the second doped region after diffusion.

2. The manufacturing method of claim 1, wherein a first type of ion doping is performed to form the first doped region, the second doped region and the third doped region.

3. The manufacturing method of claim 2, wherein a second type of ion doping is performed to provide the substrate and to form the first pinning layer, wherein the second ion doping type is different from the first ion doping type; and
   the ion doping concentration of the first pinning layer is greater than the ion doping concentration of the substrate.

4. The manufacturing method of claim 1, wherein the first type of ion doping is performed to form the third doped region and the ion doped region of the storage node; and
   the ion doping concentration of the ion doped region of the storage node is greater than the ion doping concentration of the third doped region.

5. The manufacturing method of claim 4, wherein a second type of ion doping is performed to provide the substrate and to form the fourth doped region, wherein the second ion doping type is different from the first ion doping type; and the ion doping concentration of the fourth doped region is greater than the ion doping concentration of the substrate.

6. The manufacturing method of claim 4, wherein forming the fourth doped region further comprises forming an extension extending laterally toward the photodiode, and forming the extension further includes extending the extension upward in the height direction of the substrate.

7. A manufacturing method of manufacturing a semiconductor structure for forming a CMOS image sensor, the manufacturing method comprising:

providing a substrate;

forming a second doped region, a first doped region and a first pinning layer sequentially from bottom to top in a height direction of the substrate in the substrate to form a photodiode of the CMOS image sensor;

forming a third doped region in the substrate corresponding to an extending region of the second doped region in a lateral direction orthogonal to the height direction, wherein a first type of ion doping is performed to form the first doped region, the second doped region and the third doped region, and wherein the ion doping concentration of the first doped region is greater than the ion doping concentration of the second doped region, and the ion doping concentration of the second doped region is greater than the ion doping concentration of the third doped region such that the formed third doped region is in contact with the second doped region after diffusion.

8. The manufacturing method of claim 7, wherein a second type of ion doping is performed to provide the substrate and to form the first pinning layer, wherein the second ion doping type is different from the first ion doping type; and the ion doping concentration of the first pinning layer is greater than the ion doping concentration of the substrate.

9. The manufacturing method of claim 7, wherein the manufacturing method further comprises:

forming an ion doped region and a second pinning layer in order from bottom to top in the substrate in the height direction of the substrate to form a storage node of the CMOS image sensor; and the storage node is formed over the third doped region, and the third doped region is isolated from the ion doped region of the storage node.

10. The manufacturing method of claim 9, wherein the first type of ion doping is performed to form the third doped region and the ion doped region of the storage node; and the ion doping concentration of the ion doped region of the storage node is greater than the ion doping concentration of the third doped region.

11. The manufacturing method of claim 10, wherein the manufacturing method further comprises:

forming a fourth doped region between the third doped region and the ion doped region of the storage node, the third doped region is isolated from the ion doped region of the storage node by the fourth doped region.

12. The manufacturing method of claim 11, wherein a second type of ion doping is performed to provide the substrate and to form the fourth doped region, wherein the second ion doping type is different from the first ion doping type; and the ion doping concentration of the fourth doped region is greater than the ion doping concentration of the substrate.

13. The manufacturing method of claim 11, wherein forming the fourth doped region further comprises forming an extension extending in the lateral direction toward the photodiode, and forming the extension further includes extending the extension upward in the height direction of the substrate.

14. The manufacturing method of claim 7, further comprising:

forming a storage node over the third doped region, the storage node including an ion doped region and a second pinning layer in order from bottom to top in the substrate in the height direction of the substrate, wherein the first type of ion doping is performed to form the ion doped region of the storage node, and a second type of ion doping is performed to provide the substrate, the third doped region is spaced apart from the ion doped region of the storage node in the height direction by a portion of the substrate.

* * * * *